(12) United States Patent
Shin et al.

(10) Patent No.: US 10,571,726 B2
(45) Date of Patent: Feb. 25, 2020

(54) DISPLAY PANEL AND DISPLAY DEVICE

(71) Applicant: LG DISPLAY CO., LTD., Seoul (KR)

(72) Inventors: SeungHwan Shin, Jeonju-si (KR); Gyutae Kang, Goyang-si (KR); Daeyoung Seo, Paju-si (KR); Soyoung Lee, Seoul (KR); YoungMin Jeong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 173 days.

(21) Appl. No.: 15/682,944

(22) Filed: Aug. 22, 2017

(65) Prior Publication Data

US 2018/0120614 A1    May 3, 2018

(30) Foreign Application Priority Data

Oct. 28, 2016 (KR) .................. 10-2016-0141887

(51) Int. Cl.
*G02F 1/133* (2006.01)
*G02F 1/1368* (2006.01)
(Continued)

(52) U.S. Cl.
CPC ........ *G02F 1/13306* (2013.01); *G02F 1/1368* (2013.01); *G09G 3/3607* (2013.01);
(Continued)

(58) Field of Classification Search
CPC . G02F 1/13306; G02F 1/1368; G09G 3/3607; G09G 3/3648; G09G 3/3225;
(Continued)

(56) References Cited

U.S. PATENT DOCUMENTS 7,859,526 B2 * 12/2010 Konicek .............. G06K 9/0004
                                                    345/156
2003/0222849 A1 * 12/2003 Starkweather ........ G06F 3/0386
                                                    345/156
(Continued)

FOREIGN PATENT DOCUMENTS

CN        1856766 A    11/2006

OTHER PUBLICATIONS

Notification of the First Office Action dated Dec. 2, 2019, issued in corresponding Chinese Patent Application No. 201710915991.X.

*Primary Examiner* — Ariel A Balaoing
(74) *Attorney, Agent, or Firm* — Morgan, Lewis & Bockius LLP

(57) ABSTRACT

A display panel and display device are provided that may be capable of sensing an external light source, such as a laser. The display device may include a display panel including gate lines, data lines, and sub-pixels defined at intersections between the gate lines and the data lines; a light source-sensing circuit in an inactive area of the sub-pixels to sense an external light source; and a monochromatic color filter pattern disposed on a sensor transistor of the light source-sensing circuit. Thus, the incident amount of an external light source other than a laser can be reduced, and the incident amount of the laser can be increased. Accordingly, it may be possible to decrease an initial off-current caused by an external light source and improve the sensitivity in laser sensing. Thus, the size of the sensor transistor can be reduced and aperture ratio can be increased.

13 Claims, 15 Drawing Sheets

(51) Int. Cl.
*H01L 27/144* (2006.01)
*G09G 3/36* (2006.01)
*H01L 27/32* (2006.01)
*G02F 1/1362* (2006.01)
*H01L 31/113* (2006.01)
*H01L 27/12* (2006.01)
*G09G 3/3225* (2016.01)
*G09G 3/3266* (2016.01)
*G09G 3/3275* (2016.01)

(52) U.S. Cl.
CPC ...... H01L 27/1443 (2013.01); H01L 27/3227 (2013.01); *G02F 1/136209* (2013.01); *G02F 1/136227* (2013.01); *G02F 2001/13312* (2013.01); *G02F 2001/136222* (2013.01); *G09G 3/3225* (2013.01); *G09G 3/3266* (2013.01); *G09G 3/3275* (2013.01); *G09G 3/3677* (2013.01); *G09G 3/3688* (2013.01); *G09G 2300/0452* (2013.01); *G09G 2310/08* (2013.01); *G09G 2360/144* (2013.01); *H01L 27/1214* (2013.01); *H01L 27/322* (2013.01); *H01L 27/3262* (2013.01); *H01L 31/1136* (2013.01)

(58) Field of Classification Search
CPC .. G09G 3/5278; G09G 3/3677; G09G 3/3688; H01L 27/1443; H01L 27/3227
See application file for complete search history.

(56) References Cited

U.S. PATENT DOCUMENTS

| | | | |
|---|---|---|---|
| 2005/0212733 A1* | 9/2005 | Tateuchi | G06F 3/0412 345/81 |
| 2006/0077167 A1* | 4/2006 | Kim | G02F 1/133555 345/98 |
| 2006/0290683 A1 | 12/2006 | Pasquariello et al. | |
| 2006/0290684 A1* | 12/2006 | Giraldo | G02B 6/0038 345/175 |
| 2007/0268206 A1* | 11/2007 | Kinoshita | G06F 3/0412 345/30 |
| 2008/0030492 A1* | 2/2008 | Lee | G02F 1/1333 345/207 |
| 2011/0057908 A1* | 3/2011 | Park | G06F 3/0412 345/176 |
| 2013/0027356 A1* | 1/2013 | Nishida | G06F 3/042 345/175 |
| 2015/0145840 A1* | 5/2015 | Lim | H01L 27/1446 345/207 |

\* cited by examiner

FIG.14

| R | G | B | W | R | G | B | W |
|---|---|---|---|---|---|---|---|
| B | W | R | G | B | W | R | G |
| R | G | B | W | R | G | B | W |
| B | W | R | G | B | W | R | G |
| R | G | B | W | R | G | B | W |
| B | W | R | G | B | W | R | G |
| R | G | B | W | R | G | B | W |
| B | W | R | G | B | W | R | G |

▨ R

C/F

DISPLAY PANEL AND DISPLAY DEVICE

CROSS-REFERENCE TO RELATED APPLICATIONS

This application claims priority from Korean Patent Application No. 10-2016-0141887, filed on Oct. 28, 2016, which is hereby incorporated by reference for all purposes as if fully set forth herein.

BACKGROUND

Technical Field

The present disclosure relates to a display panel and a display device capable of sensing an external light source.

Description of the Related Art

With progress of the information-oriented society, various types of demands for display devices for displaying an image have increased. Various types of display devices such as a liquid crystal display, a plasma display panel, and an organic light emitting diode display device have been used.

Recently, such display devices have been widely used to substitute for a beam projector and screen, for example, in presentations. That is, a presentation can be carried out while displaying images through a display device and, thus, the presentation can be given with high-definition images.

When a presentation is carried out, a laser pointer or the like is often used to indicate portions of an image displayed on a screen. In this case, if a laser pointer is used on a white screen used with a beam projector, the white screen has a high reflectivity and diffused reflection occurs. Thus, the visibility of the laser pointer may be increased.

However, if the laser pointer is used on a screen of a display device, most of the laser irradiated to a panel of the display device penetrates into the panel or is absorbed into the panel, or specular reflection—not diffused reflection—occurs. Thus, the laser pointer is not well recognized by the human eye.

Accordingly, a method for improving the visibility of a laser irradiated to a panel of a display device is required to meet the needs for display devices which have substituted for a beam projector and screen.

SUMMARY

Accordingly, embodiments of the present disclosure are directed to a display panel and a display device that substantially obviate one or more of the problems due to limitations and disadvantages of the related art.

An aspect of the present disclosure provides a display panel and a display device that enable a laser irradiated to the panel of the display device to be recognized by the human eye.

Another aspect of the present disclosure provides a display panel and display device that can sense a laser irradiated to the panel of the display device and display a position of the irradiated laser.

Yet another aspect of the present disclosure provides a display panel and a display device that can sense a laser irradiated to the panel of the display device while reducing the effects of an external light source and improving the sensitivity in laser sensing.

Additional features and advantages of the disclosure will be set forth in the description that follows, and in part will be apparent from the description, or may be learned by practice of the disclosure. The objectives and other advantages of the disclosure will be realized and attained by the structure particularly pointed out in the written description and claims hereof as well as the appended drawings.

To achieve these and other aspects of the inventive concepts as embodied and broadly described, a display device may comprise a display panel including a plurality of gate lines, a plurality of data lines, and a plurality of sub-pixels defined at intersections between the gate lines and the data lines; a light source-sensing circuit including a sensor transistor, the light source-sensing circuit disposed in an inactive area of at least one of the plurality of sub-pixels and configured to sense an external light source; and a monochromatic color filter pattern disposed on the sensor transistor.

Furthermore, a display panel may comprise a plurality of gate lines; a plurality of data lines; a plurality of sub-pixels at intersections between the gate lines and the data lines; a light source-sensing circuit on an inactive area in at least one of the plurality of sub-pixels; a sensor transistor in the light source-sensing circuit and in an off-state; and a monochromatic color filter pattern disposed on the sensor transistor.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain the various principles. In the drawings:

FIG. 14 and FIG. 15 are diagrams illustrating examples of a structure where the light source-sensing unit and color filter patterns are disposed depending on color filter patterns disposed on the light source-sensing unit in the display device according to the present example embodiments.

DETAILED DESCRIPTION

Figure 1:
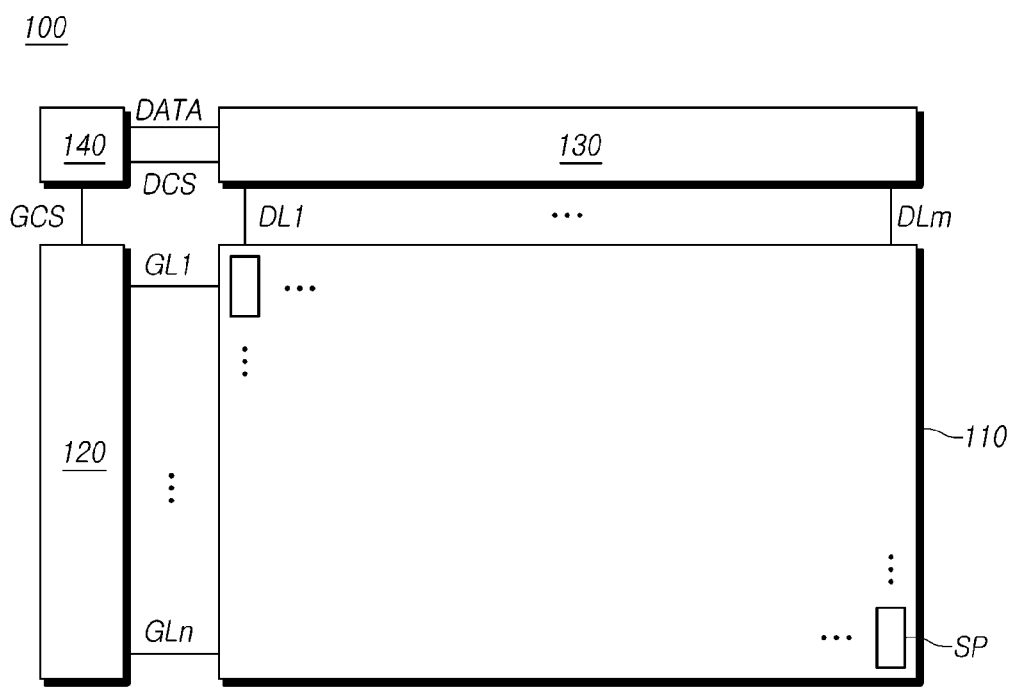
FIG. 1 is a diagram illustrating a schematic configuration of a display device according to the present example embodiments.

Hereinafter, some embodiments of the present disclosure will be described in detail with reference to the accompanying drawings. When reference numerals refer to components of each drawing, although the same components are illustrated in different drawings, the same components may be referred to by the same reference numerals where possible. Further, if it is considered that description of related known configuration or function may cloud the gist of the present disclosure, the description thereof will be omitted.

Further, in describing components of the present disclosure, terms such as first, second, A, B, (a), (b), etc. can be used. These terms are used only to differentiate the components from other components. Therefore, the nature, order, sequence, or number of the corresponding components is not limited by these terms. It is to be understood that when one element is referred to as being "connected to" or "coupled to" another element, it may be directly connected to or directly coupled to another element, connected to or coupled to another element, having still another element "intervening" therebetween, or "connected to" or "coupled to" another element via still another element.

FIG. 1 illustrates a schematic configuration of a display device 100 according to the present example embodiments.

With reference to FIG. 1, the display device 100 according to the present example embodiments may include a display panel 110 in which a plurality of gate lines GL and a plurality of data lines DL are disposed and a plurality of sub-pixels SP is disposed at intersections between the gate lines GL and the data lines DL, a gate driver 120 that drives the plurality of gate lines GL, a data driver 130 that supplies a data voltage to the plurality of data lines DL, and a controller 140 that controls driving of the gate driver 120 and the data driver 130.

The gate driver 120 sequentially drives the plurality of gate lines GL by sequentially supplying a scan signal (gate signal) to the plurality of gate lines GL.

The gate driver 120 sequentially drives the plurality of gate lines GL by sequentially supplying an ON voltage or OFF voltage gate signal to the plurality of gate lines GL under the control of the controller 140.

The gate driver 120 may be located on only one side or both sides of the display panel 110, depending on a driving method.

Also, the gate driver 120 may include one or more gate driver integrated circuits.

Each gate driver integrated circuit may be connected to a bonding pad of the display panel 110 through a Tape Automated Bonding (TAB) method or a Chip On Glass (COG) method or may be implemented in a Gate In Panel (GIP) type and then directly disposed in the display panel 110.

Otherwise, each gate driver integrated circuit may be integrated and disposed in the display panel 110, or may be implemented in a Chip On Film (COF) type in which the gate driver integrated circuit is mounted on a film connected to the display panel 110.

The data driver 130 drives the plurality of data lines DL by supplying a data voltage to the plurality of data lines DL.

If a specific gate line GL is opened, the data driver 130 converts image data received from the controller 140 into a data voltage of an analog form and supplies the data voltage to the plurality of data lines DL to drive the plurality of data lines DL.

The data driver 130 may include at least one source driver integrated circuit to drive the plurality of data lines DL.

Each source driver integrated circuit may be connected to the bonding pad of the display panel 110 through a Tape Automated Bonding (TAB) method or a Chip On Glass (COG) method or directly disposed in the display panel 110, or may be integrated and disposed in the display panel 110.

Otherwise, each source driver integrated circuit may be implemented in a Chip On Film (COF) type. In this case, one end of the source driver integrated circuit is bonded to at least one source printed circuit board and the other end is bonded to the display panel 110.

The controller 140 controls the gate driver 120 and the data driver 130 by supplying various control signals to the gate driver 120 and the data driver 130.

The controller 140 starts a scan according to timing implemented in each frame, converts image data input from the outside to be suitable for a data signal form used by the data driver 130, outputs the converted image data, and controls driving of data at a proper time corresponding to the scan.

The controller 140 receives input image data together with various timing signals, such as a vertical synchronization signal Vsync, a horizontal synchronization signal Hsync, an input data enable (DE) signal, a clock signal CLK, etc., from the outside (e.g., a host system).

The controller 140 converts the input image data input from the outside to be suitable for a data signal form used by the data driver 130 and outputs the converted image data. Further, in order to control the gate driver 120 and data driver 130, the controller 140 receives timing signals, such as a vertical synchronization signal Vsync, a horizontal synchronization signal Hsync, an input data enable signal DE, a clock signal CLK, etc., generates various control signals, and outputs the control signals to the gate driver 120 and the data driver 130.

For example, the controller 140 outputs various gate control signals (GCS) including a gate start pulse (GSP), a gate shift clock (GSC), a gate output enable signal (GOE), etc., in order to control the gate driver 120.

Herein, the gate start pulse (GSP) controls an operation start timing of the one or more gate driver integrated circuits constituting the gate driver 120. The gate shift clock (GSC) is a clock signal commonly input to the one or more gate driver integrated circuits, and controls a shift timing of a gate signal. The gate output enable signal (GOE) designates timing information of the one or more gate driver integrated circuits.

Further, the controller 140 outputs various data control signals (DCS) including a source start pulse (SSP), a source sampling clock (SSC), a source output enable signal (SOE), etc., in order to control the data driver 130.

Herein, the source start pulse (SSP) controls a data sampling start timing of the one or more source driver integrated circuits constituting the data driver 130. The source sampling clock (SSC) is a clock signal for controlling a data sampling timing in each source driver integrated circuit. The source output enable signal (SOE) controls an output timing of the data driver 130.

The controller 140 may be disposed in a control printed circuit board connected through a connection medium, such as a flexible flat cable (FFC) or a flexible printed circuit (FPC), to the source printed circuit board to which the source driver integrated circuits are bonded.

In the control printed circuit board, a power controller (not illustrated) configured to supply various voltages or currents to the display panel 110, the gate driver 120, and the data driver 130, or to control the various voltages or currents to be supplied thereto, may be further disposed. The power controller is also referred to as a power management integrated circuit (power management IC).

The display device 100 may be used to substitute for a beam projector and screen. The display device 100 may substitute for a beam projector and screen and thus enable a presentation to be carried out with high-definition images.

In this case, if a laser pointer is used on the display panel 110 of the display device 100, a position of the laser pointer may not be well recognized as compared to the case where the laser pointer is used on a white screen.

Figure 2:
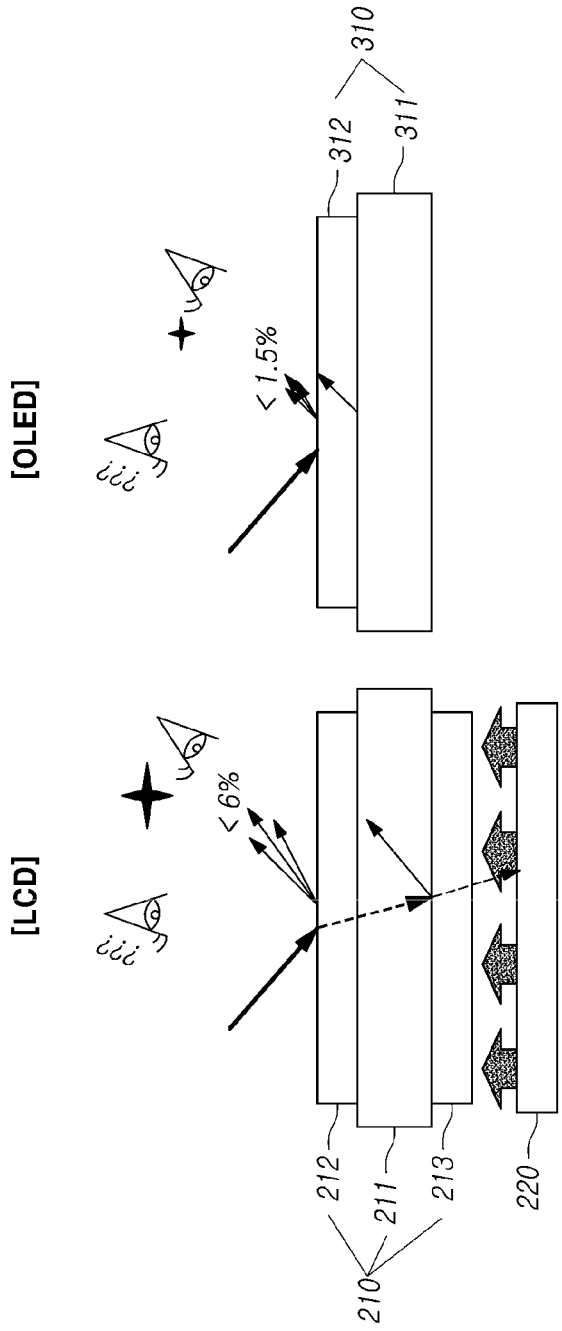
FIG. 2 is a diagram provided to explain that a laser irradiated to the display device according to the present example embodiments is not recognized.

With reference to FIG. 2, if a laser pointer is used on a liquid crystal display (LCD) or organic light emitting diode display device (OLED) as an example of the display device 100, the visibility of a laser irradiated onto the display panel 110 may be decreased.

In the liquid crystal display (LCD), a backlight unit 220 is disposed under a liquid crystal panel 210 and a light irradiated from the backlight unit 220 passes through the liquid crystal panel 210 to display an image.

The liquid crystal panel 210 includes a liquid crystal layer 211, and polarizing plates 212 and 213 are disposed on upper and lower surfaces of the liquid crystal layer 211 so that the light irradiated from the backlight unit 220 can easily pass through the liquid crystal layer 211 to the outside.

If a laser is irradiated from the outside of the liquid crystal panel 210, most of the laser penetrates into the liquid crystal panel 210 or is absorbed into the liquid crystal panel 210, or specular reflection—not diffused reflection—occurs. Thus, only a part of the irradiated laser can be recognized by the human eye.

In the organic light emitting diode display device (OLED), a self-emitting organic light emitting diode is used, and, thus, a separate light source is not disposed under an organic light emitting display panel 310, but a polarizing plate 312 is disposed on an organic light emitting layer 311 in order to improve expression such as color.

Even if a laser is irradiated from the outside of the organic light emitting display panel 310, most of the laser penetrates into the organic light emitting display panel 310 or is absorbed into the organic light emitting display panel 310. Thus, similar to the case where a laser is irradiated to the liquid crystal panel 210, the laser irradiated to the organic light emitting display panel 310 may not be easily recognized by the human eye.

The display device 100 according to the present example embodiments senses a laser irradiated from the outside of the display panel 110 and displays an image on the display panel 110 according to a sensing value. Thus, the present example embodiments provide the display panel 110 and the display device 100 which can easily recognize a position of the laser irradiated to the display panel 110.

Further, the present example embodiments provide the display panel 110 and the display device 100 which can reduce the effects of an external light source during laser sensing and thus improve the sensitivity in laser sensing.

Figure 3:
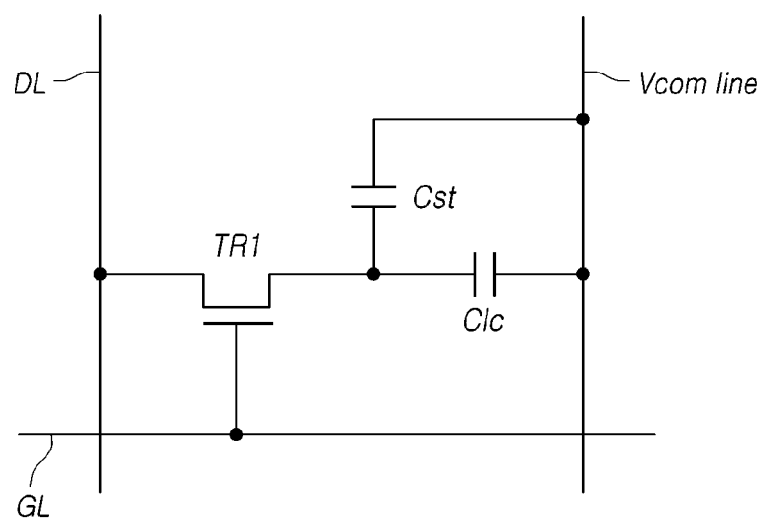
FIG. 3 is a diagram illustrating an example of a sub-pixel structure in which a light source-sensing unit is not disposed in the display device according to the present example embodiments.
Figure 4:
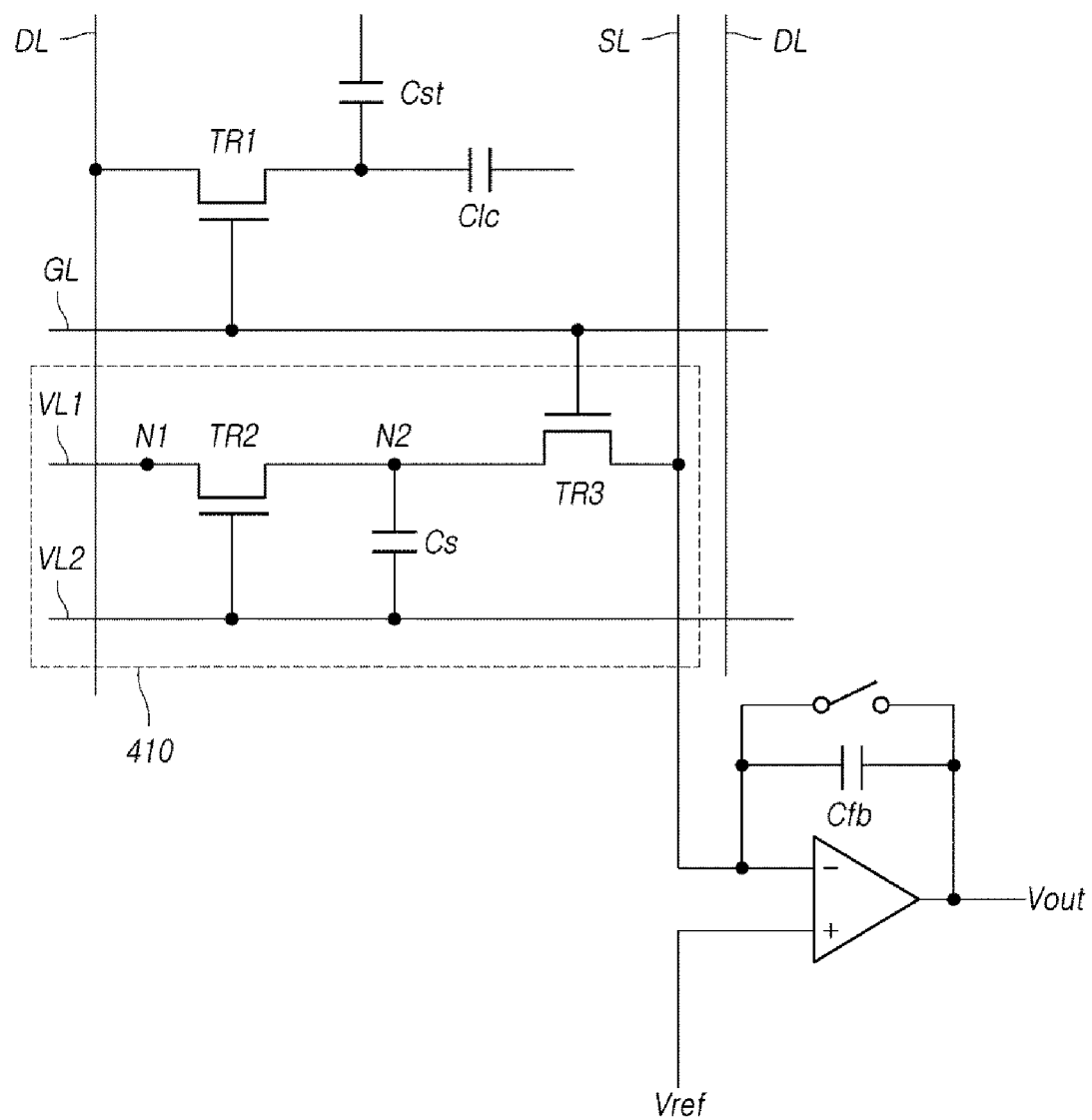
FIG. 4 is a diagram illustrating a sub-pixel structure in which a light source-sensing unit is disposed in the display device according to the present example embodiments.

FIG. 3 and FIG. 4 are provided to explain a structure of sensing an external light source in the display device 100 according to the present example embodiments. FIG. 3 illustrates an example of a sub-pixel structure in which a light source-sensing unit 410 is not disposed, and FIG. 4 illustrates a sub-pixel structure in which the light source-sensing unit 410 is disposed.

In the present example embodiments, for convenience, a sub-pixel structure of a liquid crystal display (LCD) will be described as an example. However, a light source-sensing structure of the present example embodiments is not limited thereto.

With reference to FIG. 3, a sub-pixel of the display device 100 according to the present example embodiments is defined at an intersection between a gate line GL and a data line DL and includes a first transistor TR1, a liquid crystal capacitor Clc, a storage capacitor Cst, etc.

The first transistor TR1 is electrically connected between the data line DL and a pixel electrode and controlled by a signal applied to the gate line GL.

When a scan signal is applied through the gate line GL, the first transistor TR1 is turned on to apply a data voltage supplied through the data line DL to the pixel electrode.

The liquid crystal capacitor Clc is electrically connected between the pixel electrode and a common electrode, and when the first transistor TR1 is turned on, the liquid crystal capacitor Clc is charged by a voltage difference between the data voltage applied to the pixel electrode and a common voltage applied to the common electrode.

The storage capacitor Cst is charged simultaneously with the liquid crystal capacitor Clc, and, thus, when the first transistor TR1 is turned off, the storage capacitor Cst reduces a voltage drop of the liquid crystal capacitor Clc caused by a leakage current and thus enables stable expression of gray scale during a frame.

In the present example embodiments, a structure of sensing an external light source is included in an inactive area of a sub-pixel and not an active area where an image is displayed, so that a position of the irradiated external light source can be sensed.

In each sub-pixel, an area where an image is displayed may be referred to as "active area," and an area where a circuit element or the like is disposed to drive the sub-pixel may be referred to as "inactive area."

That is, in each sub-pixel, a structure of sensing an external light source may be disposed in the inactive area, where a circuit element or the like is disposed to drive the sub-pixel, and not the active area where an image is displayed.

FIG. 4 illustrates a sub-pixel structure in which a light source-sensing unit 410, which includes circuitry discussed below, is further disposed in the inactive area of the sub-pixel, in addition to the above-described sub-pixel structure illustrated in FIG. 3.

The light source-sensing unit 410 includes a first voltage line VL1 disposed in parallel with the gate line GL, a second voltage line VL2 disposed in parallel with the first voltage line VL1, and a sensing line SL disposed intersecting with the first voltage line VL1. Furthermore, the light source-sensing unit 410 includes a second transistor TR2 for sensing an external light source, a sensor capacitor Cs which is charged with electric charges when irradiated by an external light source, and a third transistor TR3 for reading a sensing value.

The second transistor TR2 is a transistor for sensing an external light source and is also referred to as a "sensor transistor."

A first node N1 of the second transistor TR2 is connected to the first voltage line VL1 to which a light-sensing voltage is applied, and a second node N2 thereof is connected to the sensor capacitor Cs. The second transistor TR2 is disposed on an open area in the inactive area of the sub-pixel.

The second transistor TR2 maintains a turn-off state, and when an external light source irradiates the sub-pixel, the second transistor TR2 operates according to an off-current generated by the external light source so that the light-sensing voltage applied to the first node N1 is applied to the second node N2.

When the light-sensing voltage is applied to the second node N2, the sensor capacitor Cs is charged with electric charges by a voltage difference from the second voltage line VL2 so that an external light source can be sensed on the basis of the amount of electric charges charged by the external light source.

The third transistor TR3 is a transistor for reading the amount of electric charges stored in the sensor capacitor Cs to sense an external light source, and is also referred to as a "read transistor."

The third transistor TR3 is turned on by a scan signal applied to the gate line GL, so that a voltage stored in the sensor capacitor Cs can be transferred to a circuit configured to output light-sensing data through the sensing line SL.

A light-sensing image display unit (not illustrated) enables a sub-pixel disposed at a position of the irradiated external light source to display an image according to the light-sensing data obtained through the sensing line SL. The display unit may include a light source for displaying the image. Thus, the light-sensing image display unit enables a user to recognize the position of the irradiated external light source (e.g., a laser) on the display panel 110.

Therefore, according to the present example embodiments, an external light source is sensed by the light source-sensing unit 410 disposed in an inactive area of a sub-pixel, and an image is displayed on a sub-pixel disposed at a position of the sensed external light source. Thus, the visibility of a laser pointer on the display panel 110 can be improved.

In this case, if a laser is irradiated when the second transistor TR2 is turned off, an off-current is generated. However, even if a external light source other than a laser is irradiated, an off-current may be generated.

Figure 5:
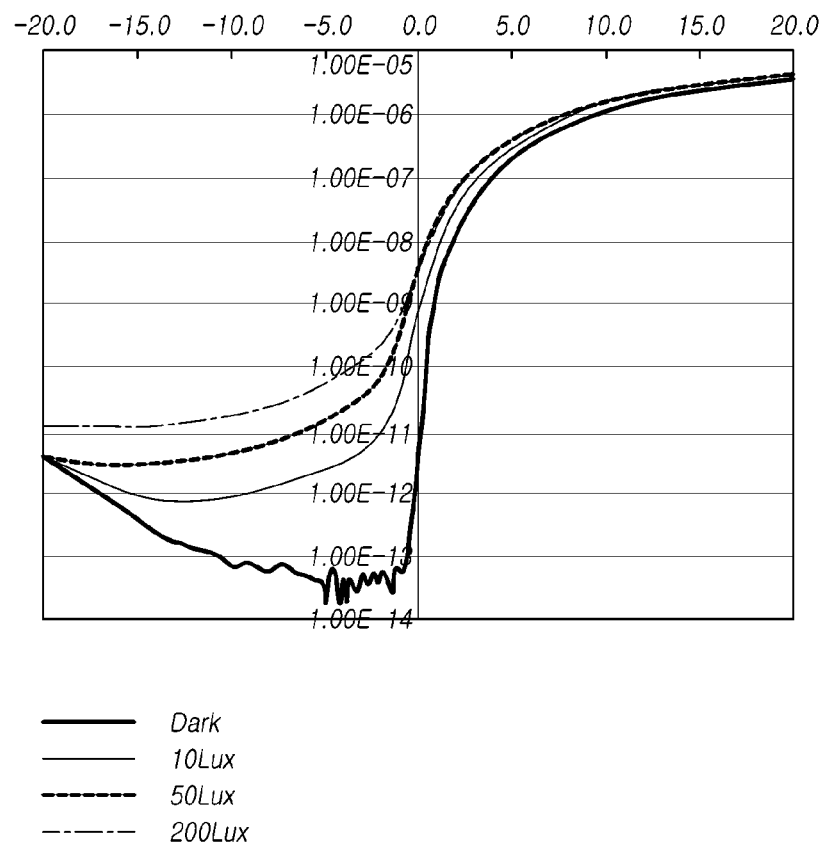
FIG. 5 is a diagram provided to explain that the sensitivity in laser sensing of the light source-sensing unit of the display device according to the present example embodiments is reduced due to any external light source other than a laser.

FIG. 5 illustrates an example of an off-current generated when an external light source is irradiated to the second transistor TR2.

With reference to FIG. 5, as compared to the case where an external light source is not irradiated (e.g., dark), if an external light source having a luminance of 10 Lux, 50 Lux, or 200 Lux is irradiated, an off-current is generated depending on the luminance of the light source.

If a laser irradiates the sub-pixel in a state where an off-current is generated by the external light source, the second transistor TR2 generates an off-current in a state where the off-current is increased. Thus, the sensitivity to the laser is decreased.

Therefore, the display device 100 according to the present example embodiments provides the light source-sensing unit 410 that senses an external light source on the display panel 110 and displays a position of the laser pointer while reducing the effects of an external light source other than a laser and improving the sensitivity in laser sensing.

Figure 6:
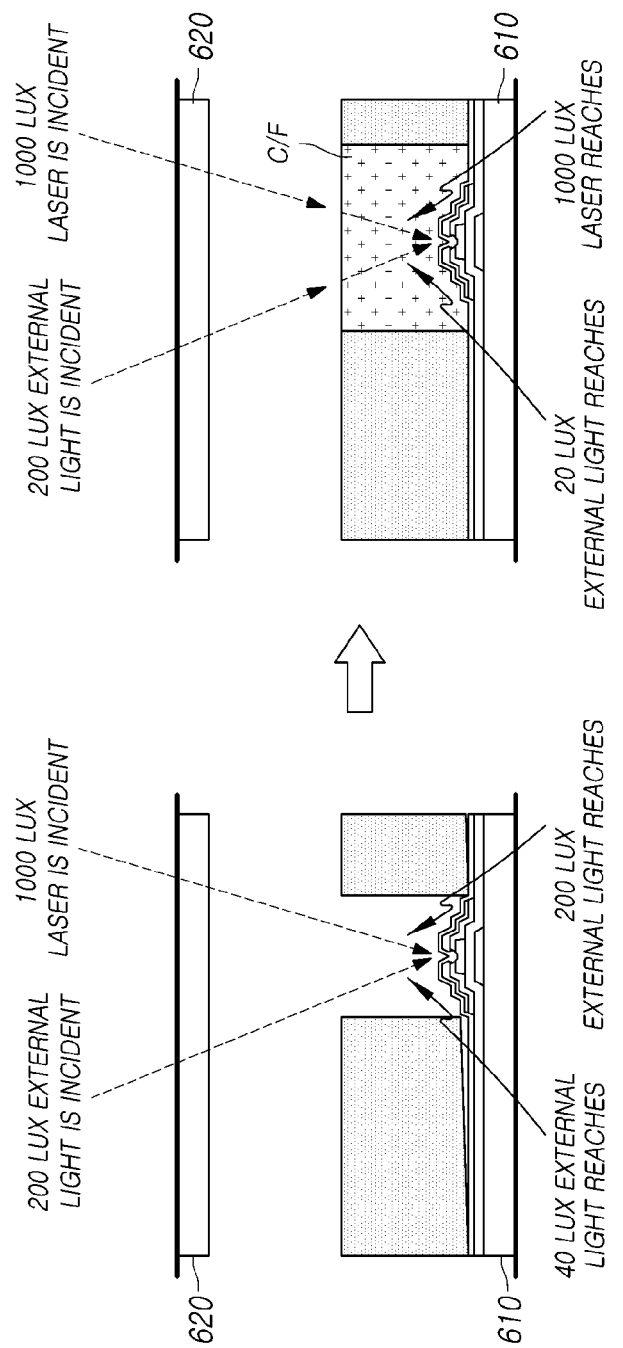
FIG. 6 is a diagram illustrating a cross section of the light source-sensing unit that reduces the effects of an external light source and improves the sensitivity to a laser in the display device according to the present example embodiments.

FIG. 6 illustrates a cross section of a structure of the light source-sensing unit 410 in the display device 100 according to the present example embodiments.

With reference to FIG. 6, the light source-sensing unit 410 disposed on a substrate 610 is disposed in an inactive area of a sub-pixel, and the second transistor TR2 of the light source-sensing unit 410 is disposed on an open area in the inactive area of the sub-pixel so as to react with an external light source.

When an external light source such as a laser is irradiated to the second transistor TR2, the laser can be sensed by an off-current generated in the second transistor TR2 and an image can be displayed on the corresponding sub-pixel.

In this case, a laser may be irradiated as the external light source incident to the second transistor TR2 through a cover glass 620. However, any external light source other than the laser may be irradiated and may decrease the sensitivity to the laser.

In the display device 100 according to the present example embodiments, a color filter pattern is disposed on the second transistor TR2 disposed in the light source-sensing unit 410 and thus decreases the incident amount of external light sources other than the laser, and transmits the laser without a decrease in intensity. Thus, the color filter pattern can improve the sensitivity in laser sensing.

For example, the color filter pattern disposed on the second transistor TR2 of the light source-sensing unit 410 may be a red (R) color filter pattern.

In this case, the external light source other than the laser is a visible light. Since the color filter pattern transmits only a red (R) light source, an initial off-current may be decreased.

Further, a laser having a red (R) short-wavelength can be incident into the second transistor TR2 through the color filter pattern without a decrease in intensity. Thus, it may be possible to reduce the effects of the external light source depending on the illumination environment, and also possible to improve the sensitivity in laser sensing.

As another example, a green (G) color filter pattern may be disposed on the second transistor TR2 of the light source-sensing unit 410.

The green (G) color filter pattern is configured to improve the sensitivity to a laser having a green (G) short-wavelength. The green (G) color filter pattern can reduce the incident amount of the external light mainly including visible lights and increase the transmittance of the laser having a green (G) short-wavelength and thus improve the sensitivity in laser sensing.

That is, according to the present example embodiments, the light source-sensing unit 410 is disposed in the inactive area of the sub-pixel and the second transistor TR2 for sensing an external light source is exposed to the outside, and, thus, an external light source may be be sensed by an off-current generated by the external light source.

However, the color filter pattern configured to filter a color corresponding to a wavelength of a laser is disposed on the second transistor TR2, and thus, an off-current caused by the external light source other than the laser can be reduced and the sensitivity in laser sensing can be improved.

Therefore, because the sensitivity in laser sensing of the second transistor TR2 is improved, the size of the second transistor TR2 can be reduced. Thus, even if a sub-pixel includes the light source-sensing unit 410 therein, a decrease in aperture ratio may be minimized.

Figure 7:
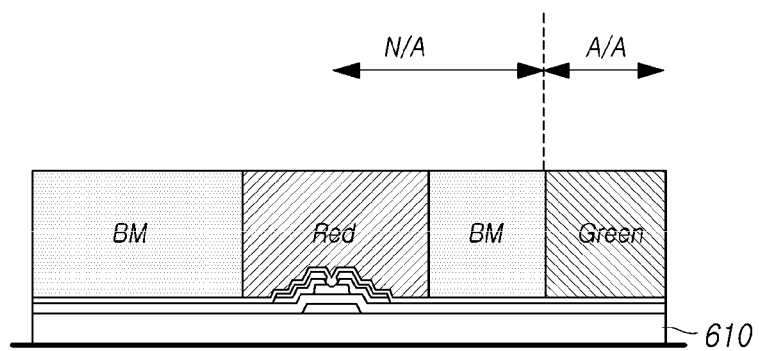
FIG. 7 through FIG. 9 are diagrams illustrating various examples of a cross section of the light source-sensing unit of the display device according to the present example embodiments.
Figure 8:
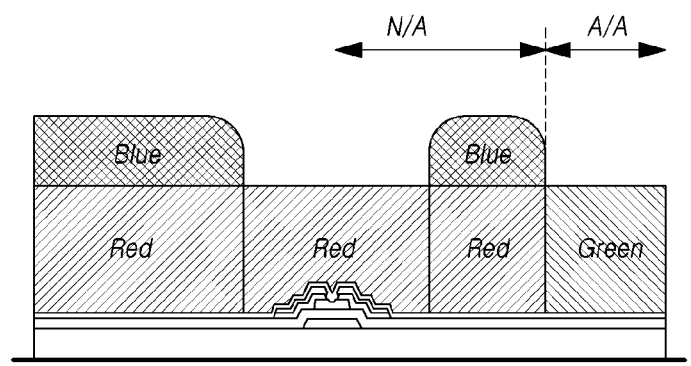
Figure 9:
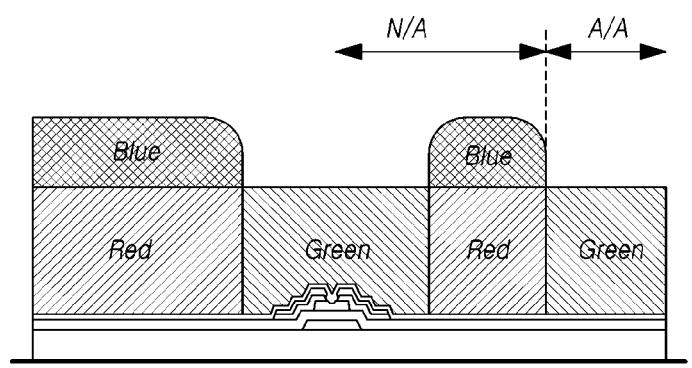

FIG. 7 through FIG. 9 are cross-sectional views illustrating examples of a structure of the light source-sensing unit 410 in which the color filter pattern is disposed on the second transistor TR2.

With reference to FIG. 7, a black matrix is disposed in the inactive area of the sub-pixel.

In the active area of the sub-pixel, a color filter pattern (e.g., green (G)) having a color expressed by the corresponding sub-pixel is disposed. In the inactive area, a black matrix is disposed. Further, the black matrix is not disposed on the second transistor TR2 for sensing an external light source.

Therefore, in the light source-sensing unit 410 disposed in the inactive area of the sub-pixel, the black matrix is disposed on a circuit element disposed in an area except an area where the second transistor TR2 is disposed.

Further, a color filter pattern (e.g., red (R)) that transmits a light having a wavelength corresponding to the laser is disposed on the second transistor TR2. Thus, the incident amount of an external light source such as a visible light incident into the second transistor TR2 can be reduced and the incident amount of the laser can be increased.

Meanwhile, in a structure where color filter patterns are laminated so as to function as a black matrix, the color filter patterns may be disposed as being laminated in an area except an area where the second transistor TR2 is disposed.

With reference to FIG. 8 and FIG. 9, red (R) and blue (B) color filter patterns are laminated in the inactive area of the sub-pixel so as to function as a black matrix.

In the light source-sensing unit 410 disposed in the inactive area of the sub-pixel, a color filter pattern, such as a red (R) or green (G) color filter pattern, that transmits a light having a wavelength corresponding to the laser, is disposed on the second transistor TR2, and color filter patterns are laminated on the other area so as to constitute the inactive area of the sub-pixel.

FIG. 8 illustrates the example where a red (R) color filter pattern is disposed on the second transistor TR2 of the light source-sensing unit 410.

In the active area of the sub-pixel, a color filter pattern (e.g., green (G)) having a color expressed by the corresponding sub-pixel is disposed. In the inactive area of the sub-pixel, red (R) and blue (B) color filter patterns are laminated.

In this case, a red (R) color filter pattern is disposed on the second transistor TR2 of the light source-sensing unit 410 in order to increase the transmittance of a laser having a red (R) short-wavelength.

Therefore, if a black matrix is formed as a lamination of color filter patterns, the red (R) color filter pattern disposed on the second transistor TR2 may be formed together with a red (R) color filter pattern disposed in the inactive area of the sub-pixel.

FIG. 9 illustrates the example where a green (G) color filter pattern is disposed on the second transistor TR2 of the light source-sensing unit 410.

In the light source-sensing unit 410 disposed in the inactive area of the sub-pixel, red (R) and blue (B) color filter patterns are laminated in an area except an area where the second transistor TR2 is disposed. A green (G) color filter pattern is disposed on the second transistor TR2.

Therefore, a color filter pattern disposed on the second transistor TR2 to improve the sensitivity of the light source-sensing unit 410 to a laser may be easily formed together with a color filter pattern functioning as a black matrix or a color filter pattern disposed in the active area.

Figure 10:
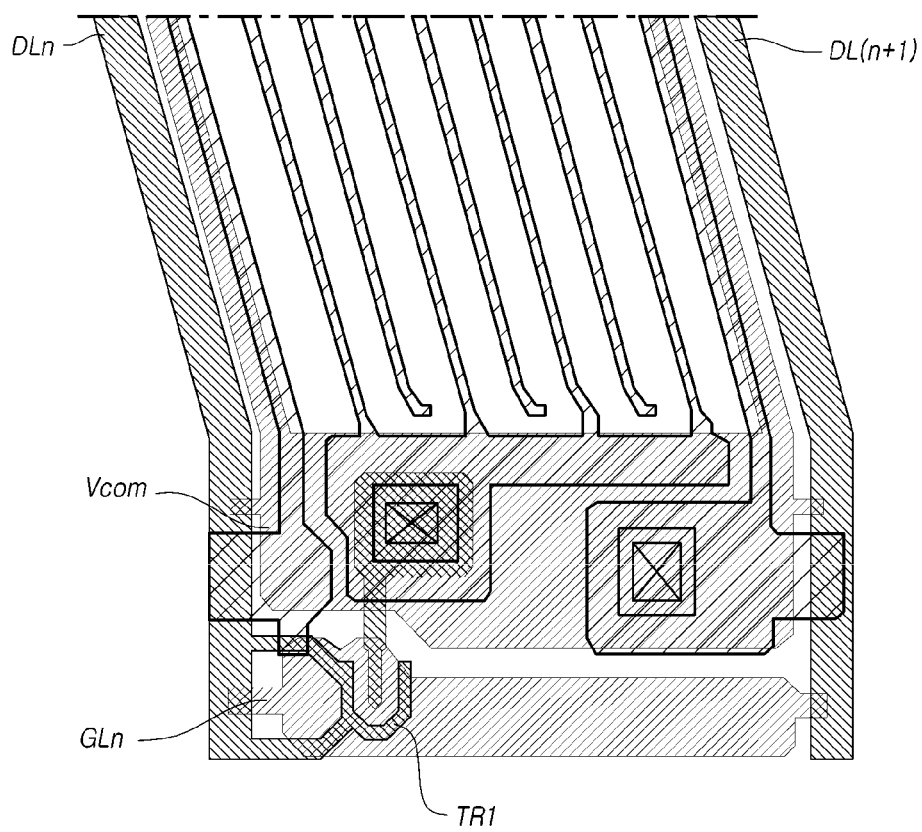
FIG. 10 and FIG. 11 are diagrams illustrating an array structure example of a sub-pixel where the light source-sensing unit of the display device according to the present example embodiments is not disposed and an array structure example of a sub-pixel where the light source-sensing unit is disposed.
Figure 11:
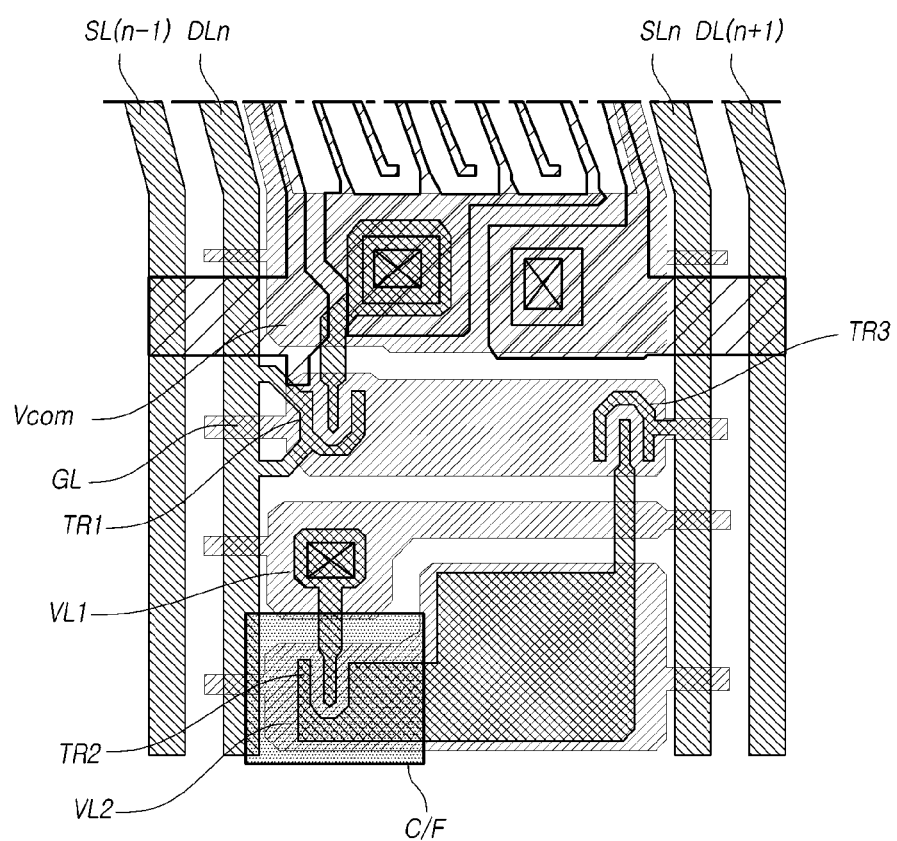

FIG. 10 and FIG. 11 are plan views illustrating array structure examples of a sub-pixel in the display device 100 according to the present example embodiments.

FIG. 10 illustrates a structure of a sub-pixel where the light source-sensing unit 410 is not disposed, and FIG. 11 illustrates a structure of a sub-pixel where the light source-sensing unit 410 is disposed.

With reference to FIG. 10, the first transistor TR1 for driving the sub-pixel is disposed and a gate line GL is disposed under the first transistor TR1.

When a scan signal is applied to the gate line GL, the first transistor TR1 forms a channel so as to apply a data voltage supplied through a data line DL to a pixel electrode and thus express a gray scale depending on the data voltage.

In a sub-pixel of the display device 100 according to the present example embodiments, a structure of sensing an external light source is disposed on a lower end of an area where circuit elements for driving the sub-pixel are disposed. Thus, it is possible to sense a position of an external light source irradiated on the display panel 110.

With reference to FIG. 11, in the sub-pixel, the first voltage line VL1 to which a light-sensing voltage is applied is disposed on a lower end of the gate line GL and the second voltage line VL2 is disposed on a lower end of the first voltage line VL1.

The second transistor TR2 is connected to the first voltage line VL1, and when an off-current is generated by an external light source, the second transistor TR2 enables a light-sensing voltage to be applied to one end of the sensor capacitor Cs and thus enables the sensor capacitor Cs to store electric charges.

The third transistor TR3 is electrically connected between the sensor capacitor Cs and a sensing line SL and driven by the scan signal applied to the gate line GL, and thus enables a voltage depending on electric charges stored in the sensor capacitor Cs to be sensed through the sensing line SL.

In this case, on a circuit element disposed in the inactive area of the sub-pixel, a black matrix may be disposed or color filter patterns in two different colors may be laminated.

Further, the second transistor TR2 is disposed on an open area so as to react with an external light source.

In order for the second transistor TR2 to reduce the generation of an off-current caused by an external light source other than a laser and improve the sensitivity to the laser, a color filter pattern is disposed on the second transistor TR2.

Therefore, a color filter pattern that transmits a color corresponding to a wavelength of the laser is disposed only on the second transistor TR2. Thus, the effect of an external light source on the second transistor TR2 can be reduced and the sensitivity in laser sensing can be improved. Therefore, the laser sensing performance can be improved.

The light source-sensing unit 410 may be disposed in inactive areas of all the sub-pixels, or may be disposed in some of the sub-pixels on the basis of the diameter of a laser light source.

Figure 12:
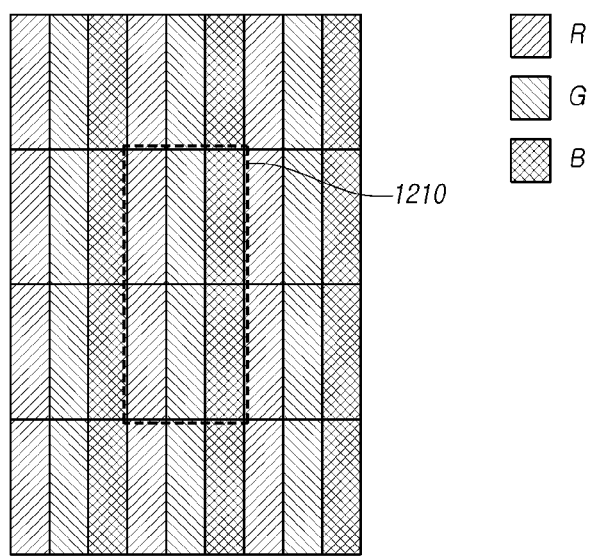
FIG. 12 and FIG. 13 are diagrams illustrating examples of a sub-pixel area where the light source-sensing unit is disposed in the display device according to the present example embodiments.
Figure 13:
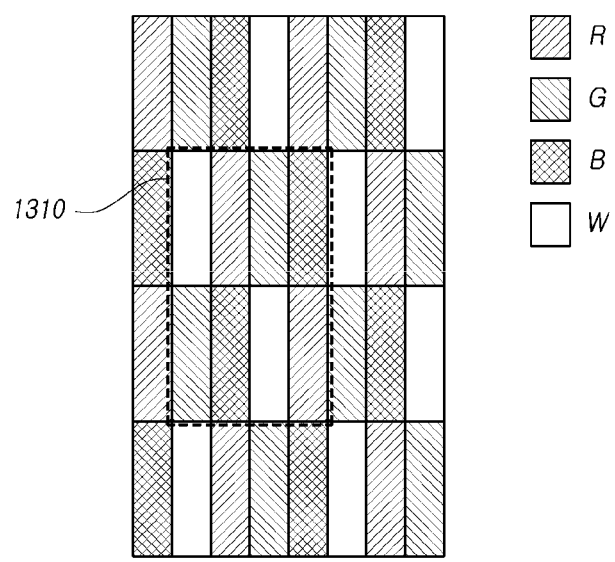

FIG. 12 and FIG. 13 illustrate examples of a position of a sub-pixel where the light source-sensing unit 410 is disposed in the display device 100 according to the present example embodiments.

FIG. 12 illustrates that the light source-sensing unit 410 is disposed in sub-pixels including red (R), green (G), and blue (B) sub-pixels on the display panel 110.

If the laser light source has a diameter of from about 1 mm to about 2 mm, the light source-sensing unit 410 may be disposed in only any one of sub-pixels from among sub-pixels included in a predetermined area depending on the size and resolution of the display panel 110.

For example, the light source-sensing unit 410 may be disposed on each of 3 by 2 sub-pixels as indicated by 1210, and the light source-sensing unit 410 may be disposed on a blue (B) sub-pixel having a high aperture ratio from among red (R), green (G), and blue (B) sub-pixels.

If the light source-sensing unit 410 is disposed in only any one of the 3 by 2 sub-pixels and a laser is sensed by the light source-sensing unit 410, an image is displayed on the 3 by 2 sub-pixels including the sub-pixel where the light source-sensing unit 410 is disposed.

That is, the light source-sensing unit 410 is disposed so as to sense a laser light source depending on the diameter of the laser light source, and if the laser light source is sensed, sub-pixels included in an area corresponding to the diameter of the laser light source display an image, and, thus, a position of the irradiated laser can be recognized by the human eye.

FIG. 13 illustrates that the light source-sensing unit 410 is disposed on sub-pixels including red (R), green (G), blue (B), and white (W) sub-pixels on the display panel 110.

The light source-sensing unit 410 may be disposed on only any one of sub-pixels included in a 4 by 2 sub-pixel area as indicated by 1310 in FIG. 13, and the light source-sensing unit 410 may be disposed on a white (W) or blue (B) sub-pixel having a high aperture ratio.

If the light source-sensing unit 410 senses a laser irradiated to the display panel 110, an image is displayed on the 4 by 2 sub-pixel area including the light source-sensing unit 410. Thus, the image can be displayed on an area corresponding to the diameter of the laser light source at a position of the irradiated laser.

Therefore, even if a laser irradiated to the display panel 110 penetrates into the display panel 110 or is absorbed into the display panel 110 or specularly reflected, an image is displayed at a position of the irradiated laser according to sensing by the light source sensing unit 410. Thus, a position pointed by the laser pointer can be recognized by the human eye.

Figure 15:
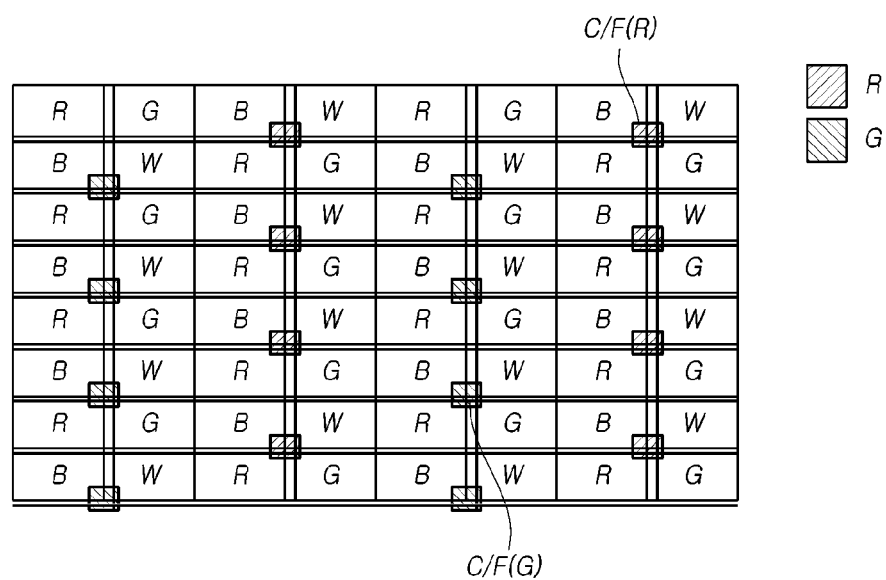

FIG. 14 and FIG. 15 illustrate positions of color filter patterns disposed on the second transistor TR2 of the light source-sensing unit 410 when the light source-sensing unit 410 is disposed for every predetermined number of sub-pixels in the display panel 110.

FIG. 14 illustrates the case where color filter patterns disposed on the second transistor TR2 of the light source-sensing unit 410 have the same color.

As in the above-described example, if the sub-pixels include red (R), green (G), blue (B), and white (W) sub-pixels, the light source-sensing unit 410 may be disposed for every 4 by 2 sub-pixels.

The light source-sensing unit 410 may be disposed on a white (W) or blue (B) sub-pixel having a high aperture ratio, and a color filter pattern is disposed on the second transistor TR2 at every position where the light source-sensing unit 410 is disposed.

FIG. 14 illustrates the case where red (R) color filter patterns are disposed. If a laser having a red (R) wavelength is irradiated, the red color filter patterns transmit the laser without a decrease in intensity. Thus, the sensitivity in laser sensing can be improved.

If the laser is sensed by the light source-sensing unit 410, an image is displayed on sub-pixels in a predetermined area from a position of the sensed laser. Thus, a position of the irradiated laser can be recognized.

The color filter patterns disposed on the second transistor TR2 of the light source-sensing unit 410 may have a green (G) color.

In this case, if a laser having a green (G) wavelength is irradiated, the effects of an external light source other than the laser can be reduced and the incident amount of the laser can be increased. Thus, the sensitivity in laser sensing can be improved.

As described above, if color filter patterns having the same color are disposed on the second transistor TR2, the light source-sensing unit 410 where the color filter patterns are disposed may be disposed for every predetermined number of sub-pixels in consideration of the diameter of the laser light source and the size of a sub-pixel.

In this case, if the color filter patterns having the same color are disposed on the second transistor TR2 of the light source-sensing unit 410, the sensitivity in sensing may vary depending on a wavelength of the laser.

Therefore, the color filter patterns disposed on the second transistor TR2 of the light source-sensing unit 410 may have a plurality of colors.

FIG. 15 illustrates the case where color filter patterns disposed on the second transistor TR2 of the light source-sensing unit 410 have a plurality of colors in the display device 100 according to the present example embodiments.

For example, the color filter patterns disposed on the second transistor TR2 of the light source-sensing unit 410 may include red (R) and green (G) color filter patterns.

In this case, the light source-sensing unit 410 is disposed in consideration of the diameter of the laser light source and the size of a sub-pixel. The light source-sensing unit 410 may be disposed so that sub-pixels disposed in a predetermined area can sense both a laser having a red (R) wavelength and a laser having a green (G) wavelength.

That is, if the light source-sensing unit 410 is disposed for every 4 by 2 sub-pixels, the light source-sensing unit 410 where a red (R) color filter pattern is disposed may be disposed in a sub-pixel for every 4 by 2 sub-pixels in consideration of the diameter of the laser light source and the size of a sub-pixel.

Also, the light source-sensing unit 410 where a green (G) color filter pattern is disposed may be disposed in a sub-pixel for every 4 by 2 sub-pixels separately from the light source-sensing unit 410 where the red (R) color filter pattern is disposed.

Therefore, each of the light source-sensing unit 410 where the red (R) color filter pattern is disposed and the light source-sensing unit 410 where the green (G) color filter pattern is disposed may be disposed for every 4 by 2 sub-pixels.

Accordingly, even if a laser having a red (R) wavelength or a laser having a green (G) wavelength is irradiated to a 4 by 2 sub-pixel area, the sensitivity in laser sensing can be improved. Thus, the laser sensing performance can be improved.

According to the present example embodiments, an external light source irradiated to the display panel 110 can be sensed and an image can be displayed on a sub-pixel at a position of the sensed light source. Thus, a position indicated by the laser penetrating into or absorbed into the display panel 110 can be recognized by the human eye.

Also, a color filter pattern having a color corresponding to a wavelength of a laser is disposed on the second transistor TR2 that senses the external light source. Thus, an off-current generated by the external light source except the laser can be reduced and the incident amount of the laser light source can be increased.

Therefore, it is possible to decrease an initial off-current caused by an external light source depending on illumination environment and improve the sensitivity in laser sensing. Thus, the laser sensing performance of the display panel 110 can be improved and the visibility of the laser pointer pointing to the display panel 110 can be improved.

According to the example embodiments described above, a laser irradiated to the display device may be sensed and an image is displayed at a position of the irradiated laser. Thus, a user can recognize the position of the laser irradiated to the display panel.

According to the example embodiments described above, in the display panel, the color filter patterns may be disposed on the sensor transistor that senses an external light source. Thus, it may be possible to reduce the effects of any external light source other than a laser and also possible to improve the sensitivity in laser sensing.

According to the example embodiments described above, the color filter patterns disposed on the sensor transistor of the display panel may have a plurality of colors. Thus, it may be possible to improve the sensitivity to each color of lasers used in a laser pointer and also possible to display a position of the irradiated laser on the display panel.

It will be apparent to those skilled in the art that various modifications and variations may be made in the present disclosure without departing from the technical idea or scope of the disclosure. Thus, it is intended that embodiments of the present disclosure cover the modifications and variations of the disclosure provided they come within the scope of the appended claims and their equivalents.

What is claimed is:

1. A display device, comprising:
   a display panel including a plurality of gate lines, a plurality of data lines, and a plurality of sub-pixels defined at intersections between the gate lines and the data lines;
   a light source-sensing circuit including a sensor transistor, the light source-sensing circuit disposed in an inactive area of at least one of the plurality of sub-pixels and configured to sense an external light source; and
   a monochromatic color filter pattern disposed on the sensor transistor, the display device including at least two kinds of the monochromatic color filter patterns,
   wherein a distance between adjacent sensor transistors where different monochromatic color filter patterns are disposed is smaller than a distance between adjacent sensor transistors where same monochromatic color filter patterns are disposed.

2. The display device according to claim 1, wherein the different monochromatic color filter patterns are alternately disposed in sub-pixels where the light source-sensing circuit is disposed.

3. The display device according to claim 1, wherein the light source-sensing circuit is disposed in at least one of sub-pixels included in a predetermined area, and each of a vertical distance and a horizontal distance between the sub-pixels where the light source-sensing circuit is disposed is constant.

4. The display device according to claim 1, wherein the light source-sensing circuit further includes:
   a first voltage line configured to apply a voltage to a first node of the sensor transistor;
   a second voltage line disposed in parallel with the first voltage line;
   a sensing line disposed intersecting with the first voltage line;
   a sensor capacitor electrically connected between a second node of the sensor transistor and the second voltage line; and
   a read transistor electrically connected between the second node of the sensor transistor and the sensing line.

5. The display device according to claim 1, wherein the light source-sensing circuit includes circuit elements including the sensor transistor, and a black matrix is disposed on an area of the light source-sensing circuit where all the circuit elements other than the sensor transistor are disposed.

6. The display device according to claim 1, wherein the light source-sensing circuit includes circuit elements including the sensor transistor, and color filter patterns in two different colors are laminated on an area of the light source-sensing circuit where all the circuit elements other than the sensor transistor are disposed.

7. The display device according to claim 6, wherein the light source-sensing circuit includes circuit elements including the sensor transistor, and the color filter patterns disposed on the sensor transistor are smaller in thickness than the color filter patterns laminated on the area where all the circuit elements other than the sensor transistor are disposed.

8. The display device according to claim 1, wherein the sensor transistor is in an off-state, and the sensor transistor generates an off-current during a time that it is irradiated by an external light source.

9. The display device according to claim 1, further comprising:
   a light-sensing image display circuit configured to display an image by driving sub-pixels disposed in a predetermined area from the sub-pixels where the light source-sensing circuit is disposed, according to a sensing value from the light source-sensing circuit produced during a time that the light source-sensing circuit is irradiated by an external light source.

10. A display panel, comprising:
    a plurality of gate lines;
    a plurality of data lines;
    a plurality of sub-pixels at intersections between the gate lines and the data lines;
    a light source-sensing circuit on an inactive area in at least one of the plurality of sub-pixels;
    a sensor transistor in the light source-sensing circuit and in an off-state; and
    a monochromatic color filter pattern disposed on the sensor transistor, the display panel including at least two kinds of the monochromatic color filter patterns,
    wherein a distance between adjacent sensor transistor where different monochromatic color filter patterns are disposed is smaller than a distance between adjacent sensor transistors where same monochromatic color filter patterns are disposed.

11. The display panel according to claim 10, wherein the different monochromatic color filter patterns are alternately disposed in sub-pixels where the light source-sensing circuit is disposed.

12. The display panel according to claim 10, wherein the light source-sensing circuit is disposed in at least one of sub-pixels included in a predetermined area, and each of a vertical distance and a horizontal distance between the sub-pixels where the light source-sensing circuit is disposed is constant.

13. A display device, comprising:
    a display panel including a plurality of gate lines, a plurality of data lines, and a plurality of sub-pixels;
    a light source-sensing circuit including a sensor transistor, the light source-sensing circuit disposed in an inactive area of at least one of the plurality of sub-pixels and configured to sense an external light source; and
    a monochromatic color filter pattern disposed on the sensor transistor, wherein the light source-sensing circuit includes circuit elements including the sensor transistor, and color filter patterns in two different colors are laminated on an area of the light source-sensing circuit where all the circuit elements other than the sensor transistor are disposed; and wherein the light source-sensing circuit includes circuit elements including the sensor transistor, and the color filter patterns disposed on the sensor transistor are smaller in thickness than the color filter patterns laminated on the area where all the circuit elements other than the sensor transistor are disposed.

* * * * *